United States Patent [19]

Seddon et al.

[11] Patent Number: 5,124,013
[45] Date of Patent: Jun. 23, 1992

[54] HIGH RATIO PLANETARY DRIVE SYSTEM AND METHOD FOR VACUUM CHAMBER

[75] Inventors: Richard I. Seddon; John D. Sonderman, both of Santa Rosa, Calif.

[73] Assignee: Optical Coating Laboratory, Inc., Santa Rosa, Calif.

[21] Appl. No.: 640,487

[22] Filed: Jan. 10, 1991

Related U.S. Application Data

[63] Continuation-in-part of Ser. No. 604,362, Oct. 26, 1990, abandoned, which is a continuation of Ser. No. 490,535, Mar. 5, 1990, abandoned, which is a continuation of Ser. No. 374,484, Jun. 30, 1989, abandoned, which is a continuation of Ser. No. 154,177, Feb. 8, 1988, Pat. No. 4,851,095.

[51] Int. Cl.$^5$ .................. C23C 14/22; C23C 14/34
[52] U.S. Cl. .................. 204/192.12; 204/192.15; 204/298.26; 204/298.27; 118/719; 118/730; 427/255.5

[58] Field of Search .................. 204/192.12, 192.15, 204/298.26, 298.27; 427/255.5; 118/719, 730

[56] References Cited

U.S. PATENT DOCUMENTS

| 3,562,140 | 2/1971 | Skinner et al. | 204/298.27 |
| 4,798,663 | 1/1989 | Herklotz et al. | 204/298.06 |
| 4,851,095 | 7/1989 | Scobey et al. | 204/192.12 |

Primary Examiner—Aaron Weisstuch
Attorney, Agent, or Firm—Philip A. Dalton

[57] ABSTRACT

A high ratio planetary drive system, a vacuum processing chamber system incorporating the planetary drive system, and a method of operating the system are disclosed. The planetary drive system provides relatively slow planetary workpiece rotation for effecting processing (deposition and reaction) of thin films, in particular, optical thin films, with complete film oxidation, controlled film uniformity, reduced bearing wear and reduced heat dissipation.

14 Claims, 2 Drawing Sheets

HIGH RATIO PLANETARY DRIVE SYSTEM AND METHOD FOR VACUUM CHAMBER

CROSS-REFERENCE TO RELATED APPLICATIONS

This is a continuation-in-part of commonly assigned U.S patent application Ser. No. 604,362, filed Oct. 26, 1990, now abandoned, which is a continuation of commonly assigned U.S. patent application Ser. No. 490,535, filed Mar. 5, 1990, now abandoned, which is a continuation of commonly assigned U.S. patent application Ser. No. 374,484, filed Jun. 30, 1989, now abandoned, which is a continuation of commonly assigned U.S. Pat. No. 4,851,095, entitled MAGNETRON SPUTTERING APPARATUS AND PROCESS, issued Jul. 25, 1989, to inventors Scobey, Seddon, Seeser, Austin, LeFebvre, and Manley from application Ser. No. 154,177 filed Feb. 8, 1988.

BACKGROUND OF THE INVENTION

Above-referenced U.S. Pat. No. 4,851,095, entitled MAGNETRON SPUTTERING APPARATUS AND PROCESS, issued Jul. 25, 1989, from application Ser. No. 154,177 filed Feb. 8, 1988, to inventors Scobey, Seddon, Seeser, Austin, LeFebvre, and Manley (also referred to as the Scobey, Seddon et al '095 patent or, simply, the '095 patent) discloses several embodiments of a vacuum deposition and reaction system which provides enhanced control of the thickness of optical thin films deposited on curved substrates such as tubes in a vacuum processing chamber. The '095 patent is hereby incorporated by reference in its entirety.

The system disclosed in the '095 patent incorporates a planetary drive substrate support and translation system in which (1) tubular substrates (workpieces) such as lamp bulbs or (2) cylindrical substrate supports are mounted for rotation at the circumference of a rotatable drum (or cage). One or more process (deposition and reaction) zones are spaced along the circumference of the drum.

In order to ensure reaction, e.g., oxidatior of the entire thickness of material deposited during each pass in front of the associated deposition device, the deposited layer is limited to about 5 Argstroms per pass and the exposure to the deposition and reaction zones must correspond closely. (By way of example in this patent document, we refer to the use of sputtering targets in the reaction zones and oxidizers in the reaction zones, with the understanding that other deposition and reaction devices can be used.) This objective has been achieved by rotating the substrates through an integral number of revolutions in front of the sputtering target(s) and the oxidizer.

Even a single rotation of the main drive requires several revolutions of the substrate. Consequently, consistent with these requirements, the gear ratio between the main (sun) drive shaft or spindle and the planetary substrate spindles has been selected to provide a planetary rotation speed which is much faster than the associated rotation of the main drive. For example, in one application, drum rotation of about 60 rpm effects substrate rotation of about 1,000 rpm.

In addition, the relatively high-rate planetary rotation of a substrate such as a tube is used to effect uniform film deposition around the circumference of the substrate. Similarly, uniform circumferential deposition is promoted when individual substrates are mounted around the circumference of a planetary rotating support mounted on a sun drum or cage. In both cases, axial deposition uniformity (uniformity parallel to the axis of rotation of the drum or cage) is promoted by using an axially uniform deposition source such as a linear magnetron sputter deposition device which is mounted parallel to the axis of rotation of the drum and to the planetary axis of rotation.

Despite the many advantages provided by the apparatus and methods disclosed in the '095 patent, like all things invented by man, such apparatus and methods are susceptible to improvement. In this case, the high rotation speeds and the power required to drive the planetary gear system at very high rotation speeds may result in heat dissipation in the rotary motion and bearings sufficient to degrade the system, for example, by overheating the bearings, and the process carried out in the chamber. In addition, the fast rotation in the presence of abrasive optical materials such as silicon oxide, tantalum oxide and/or titanium oxide, which are formed by the various processes practiced using the chamber, may cause wear of the many system bearings. As a result, the system may require maintenance and/or parts replacement sooner than would otherwise be necessary.

SUMMARY OF THE INVENTION

Objects of the invention

In view of the above discussion, it is one primary object of the present invention to provide a planetary drive system for a processing system which is characterized by both uniform processing and by durability.

It is yet another related object to provide the combination of such a planetary drive system and an associated processing system such as a vacuum chamber system for effecting the processing (deposition and/or reaction) of thin film coatings.

It is still another related objective to provide such a combination for processing optical thin film coatings.

Summary

As summarized above, our invention achieves objectives such as uniform film processing (including deposition and reaction) and equipment durability by using a drive train which is the converse of conventional drive trains used in such processing systems, that is, by using a drive system in which the main drive rotates at a relatively fast rate and the planetary substrates or substrate holders rotate at a relatively slow rate. This approach contradicts the conventional wisdom in the associated processing arts to the effect that uniform processing requires high rate rotation of the planetary components. In addition, our system is implemented using a simple drive train in which the differential between substrate and drum rotational speeds can be controlled by a small difference in the rotational speeds of two discs or plates. The result is a relatively simple, easily constructed and implemented, durable system which permits uniform processing and controlled process uniformity. Our invention also embodies a design and configuration of the associated processing chamber which facilitates use of the low planetary speeds.

In one specific aspect, our invention is embodied in a planetary rotation process for forming a thin film coating on a workpiece, comprising rotating the workpiece about a main axis past spaced deposition and reaction devices to separately deposit a selected material and chemically react the deposited material, while simultaneously rotating the substrate about a planetary axis, the ratio of the rotation speed about the planetary axis to that about the main axis being ≦1:1. Preferably, the rotation speed ratio is within the range 1:10 to 1:2 and, more preferably, is within the range 1:4 to 1:3. Using two deposition devices, a first layer is formed by operating the first deposition device and rotating the substrate about the main axis in a direction to traverse the shorter distance between the first deposition device and the reaction device, then a second layer is formed by operating the second deposition device and again rotating in a direction to traverse the shorter distance between the second deposition device and the reaction device.

Preferably, the deposition device(s) is (are) located 60°–120° opposite sides of the reaction device.

The process and apparatus are equally suited for depositing and reacting (e.g., oxidizing) materials to form optical thin film coatings such as silicon oxide, tantalum oxide and titanium oxide.

In another process aspect, our invention is embodied in a process for operating a planetary workpiece support system of the type having at least one workpiece support shaft driven by a main drive shaft with double rotation past a peripheral process station, comprising: rotatably supporting the workpiece drive shafts at the periphery of disc means; driving the disc means directly by the main drive shaft; and rotating the workpiece drive shaft by a gear rotatably mounted on the main drive shaft and driven by planetary gear means driven by the main drive shaft.

In one apparatus aspect, our invention is embodied in a system for forming a thin film coating on a workpiece, comprising: a deposition device; a reaction device; and means rotating a workpiece about a main axis past the deposition and reaction devices to separately deposit a selected material and chemically react the deposited material and simultaneously rotating the substrate about a planetary axis at a rotation speed such that the ratio of the rotation speed about the planetary axis to that about the main axis is ≦1:1, preferably 1:10 to 1:2 and, most preferably, 1:4 to 1:3.

The rotating means may comprise a main drive shaft; at least one workpiece support shaft; disc means mounted on and driven directly by the main drive shaft; the workpiece support shaft being mounted for rotation at the periphery of the disc means; and a gear rotatably mounted on the main drive shaft and drivingly coupled to the workpiece support shaft for driving the workpiece support shaft, said gear being driven by planetary gear means driven by the main drive shaft.

The rotating means may comprise a primary or sun drive shaft and at least one planetary workpiece support driven by the primary drive with double rotary motion past circumferential processing stations, wherein the system comprises gears A through G arranged to provide a planetary support rotational speed which is slower than the main drive shaft rotational speed according to the relationship $$w_S = w_D * (1 - AC/BD)(EG/FH),$$

where $w_S$ is the rotational speed of the planetary support, $w_D$ is the rotational speed of the primary drive, and A through H are the number of gear teeth of the like designated gears. A and J are mounted at spaced locations on and are driven directly by the main drive shaft; gears D and E are coupled together and mounted for free rotation on the main drive shaft between A and J, with D and E adjacent A and J, respectively; B and C are planetary gears coupled together for free rotation on a shaft and meshing, respectively, with A and D. The system also includes planetary substrate rotation means comprising at least one elongated substrate support drive shaft rotatably journalled at the periphery of gear or plate J, with said substrate support drive shaft mounting gear F on one side of plate J meshing with gear E and mounting gear G on the other side of plate J. Gear H is adapted for and supporting at least one workpiece, and is rotatably captured to the substrate support shaft and driven by substrate rotating gear G.

BRIEF DESCRIPTION OF THE DRAWING

The above and other aspects of our present invention are depicted in the drawing and discussed below with respect to the drawing, in which.

DETAILED DESCRIPTION OF THE PREFERRED EMBODIMENT(S)

Overview

Figure 1:
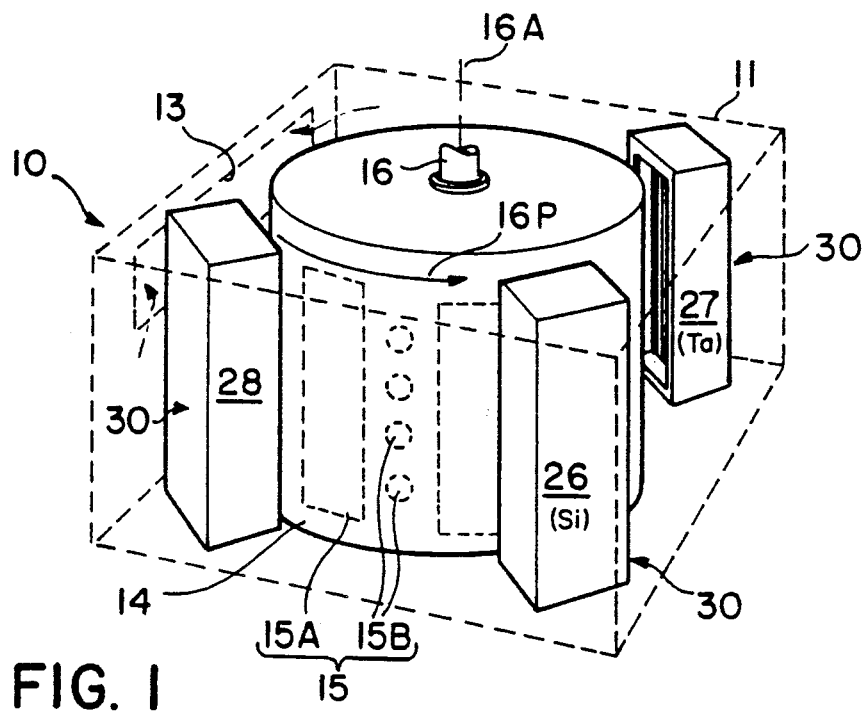
FIG. 1 schematically depicts one embodiment of a vacuum processing chamber disclosed in the above-discussed '095 patent.

As alluded to above, FIG. 1 depicts a vacuum processing chamber system 10 disclosed in the '095 patent. The illustrated system 10 comprises an enclosure/chamber 11 defined by appropriate walls, ceiling and floor, having a drum 14 therein which is rotated by drive shaft 16 along path 16P for transporting substrates 15 mounted on the periphery of the drum past circumferential work stations 30. Specifically, the substrates are transported through processing zones at selected one(s) of the work stations 30. These include circumferential deposition zones provided by deposition devices (illustratively, linear magnetron sputter devices) 26 and 27, and circumferential reaction zone(s) provided by reaction device(s) 28 such as an oxidizing device (for example, an inverse linear magnetron ion source device of the type described in the incorporated '095 patent).

Numerous embodiments are disclosed in the incorporated '095 patent. For example, the substrates 15 can be mounted directly on the drum or cage 14, facing outwardly toward the processing stations 30 which are spaced about the external circumference of the drum or facing inwardly toward stations spaced along the internal periphery.

The system 10 also includes hardware such as a vacuum pumping system (not shown) which communicates into the chamber 11 via port 13. This and other standard hardware will be readily supplied by those of usual skill in the art and, indeed, such hardware is not part of the present invention.

Figure 2:
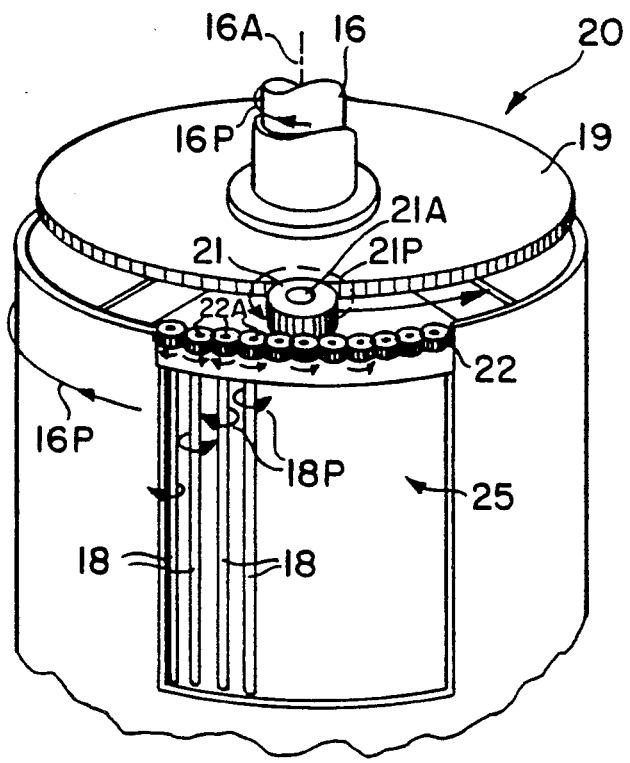
FIG. 2 depicts a planetary gear arrangement disclosed in the above-discussed '095 patent.

FIG. 2 depicts a planetary embodiment of the system of FIG. 1. This alternative system 20 may incorporate one or more planetary gear mounting arrangements 25, either in conjunction with or as a replacement for the drum 14. The planetary gear arrangement can be provided on the drum alone or in combination with the single rotation substrate mounting positions 15. The planetary gear arrangement mounts and imparts double rotational motion to articles or workpieces such as tubes 18. The system may comprise a sun gear 19 which is driven by main shaft or spindle 16 and is part of the drum 14 or is coupled directly to the drum. Alone or in conjunction with a ring gear arrangement (not shown), the sun gear or drum 14 rotates the associated planet gear(s) 21 about their rotational axes 21A as well as about the rotational axis of the drum. In the illustrated embodiment, the planet gear 21 is operatively connected to a train of gears 22 which are mounted on shafts for rotation about their axes 22A. In turn, the tubes 18 or other substrates are mounted on and rotate with the planet gear support shafts about axes 22A.

As a consequence of this planetary gear mounting arrangement, rotation of the main drive shaft 16, drum 14 and sun gear 19 at a relatively slow speed along path 16P about main drive axis 16A rotates planet gears 21 along paths 21P about axes 21A, and this rotation is converted by the gear train into relatively high rate rotation of the tubes 18 along paths 18P. This double rotary motion of the sun gear 19 and the planetary gears 21 enhances the ability to (1) coat workpieces such as tubes (or workpieces mounted on tubes or similar supports) with controlled uniformity about their circumference (or about the circumference of the supports) and (2) completely react the incremental thickness of deposited material formed during a pass through a deposition zone and, thus, form a layer which is reacted across its entire thickness.

We have discovered that the converse of the standard arrangement—by converse, we mean that a planetary gear arrangement in which the planetary-driven substrates rotate at a much lower speed than the main drive—also provides uniform film thickness, and complete reaction of the film thickness and satisfies the other requirements for forming dielectric optical thin films. The approach eliminates the problems resulting from high planetary substrate rotational speeds such as heating and wear and eliminates constraints in designing effective components such as substrate mounting assemblies.

Example(s) of Chamber Configurations

Before considering specific planetary gear system designs, consider a representative deposition device chamber configuration which permits the use of planetary systems in which the planetary substrates rotate at a fraction of the speed of the main drive, preferably about 0.1 to 0.5 of the speed of the main drive.

Figure 4:
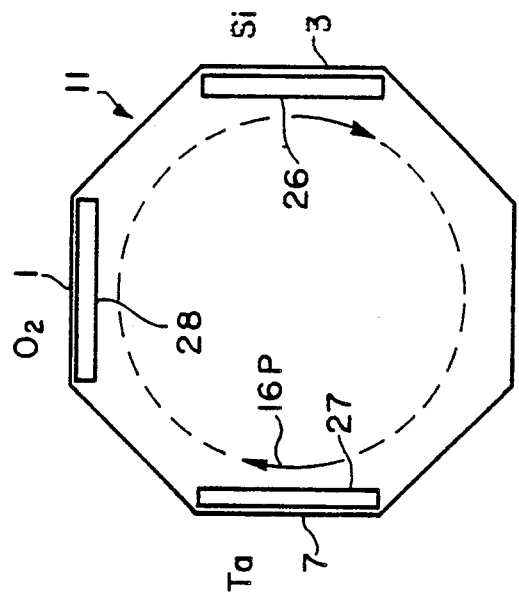
FIG. 4 depicts exemplary chamber configurations that are suitable for high rate deposition and oxidation of thin film using a low ratio of planetary rotation to main drive rotation.

Referring to FIG. 4, the illustrated octagonal chamber 11 is adapted by a tantalum sputter target 27 and a silicon sputter target 26 (deposition devices), and by the oxidizer 28 to form tantalum, silicon, tantalum oxide and silicon oxide films by selective operation of the deposition devices and the oxidizer when glass bulbs or other substrates on the planetary system (FIG. 3) are translated past the devices. Assuming eight sidewalls designated 1–8 which subtend equal angles, locating the oxidizer inside wall 1 and the silicon and tantalum deposition devices inside walls 3 and 7, respectively, results in the substrate carriers rotating 270° (silicon target) and 90° (tantalum target) of a revolution from the individual deposition stations to the oxidation station. As a result, if the gear ratio between the planetary and the primary rotation is selected to rotate the bulb or other substrate $\frac{1}{4}-\frac{1}{3}$ turn for each revolution of the main shaft, the substrates will rotate $22\frac{1}{2}-30°$ ($\frac{1}{4}-\frac{1}{3}$ of 90°) between the tantalum target and the oxidizer and $67\frac{1}{2}-90°$ ($\frac{1}{4}-\frac{1}{3}$ of 270°) between the silicon target and the oxidizer.

It should be noted that the incremental coating thickness resulting from a single passage of the substrate past a coating target is not uniform but is peaked on the side of the substrate which faces the target, falling off to near zero thickness at locations displaced 90° and more from this peak. We have demonstrated that even for materials like tantalum which are difficult to oxidize fully, a displacement of up to 30° at the oxidizer of the peak incremental layer thickness still ensures complete oxidation of the film. The displacement of 67.5–90° of the silicon film thickness peak is acceptable for this material because it is more easily oxidized, and any incompletely oxidized material is oxidized in subsequent rotations as the substrate precesses. If a material which is more difficult to oxidize than silicon is substituted in the 270° location, it is necessary to reverse the rotation of the substrate carrier for these layers to ensure substrates are suitably aligned at the oxidizer for both materials. For example, and referring to FIG. 4, the reversible main drive 16 is rotated clockwise to deposit and oxidize a layer of material using the deposition device at location 7, then the rotation is reversed to counterclockwise to deposit and oxidize a second material using the deposition device at location 3. While the 90° position is most preferred, other positions within the range 60°–120°, and preferably 60°–95°, will provide satisfactory results.

Planetary Gear System

Figure 3:
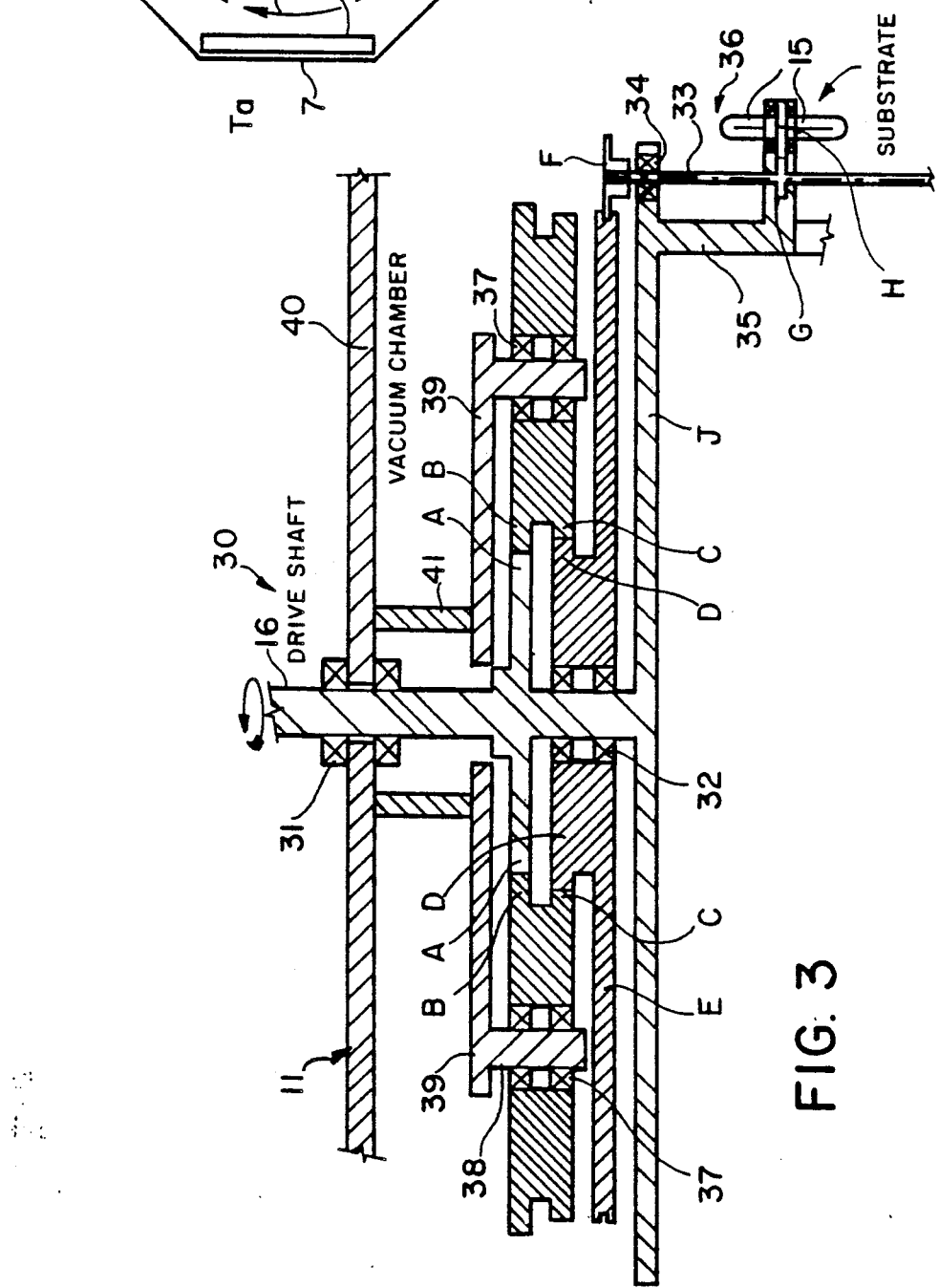
FIG. 3 schematically depicts a planetary drive system made in accordance with our present invention.

A working version of a converse planetary gear system is designated by the reference numeral 30 in FIG. 3. The high speed/low speed planet/sun system is durable, in part because of the slow rotation of the planetary and substrate mount components relative to the prior approach. The slow substrate rotation is caused by the small difference in rotational speeds of two discs E and J, using a small number of parts and, preferably, a symmetrical arrangement.

Referring further to the schematic cross-section view shown in FIG. 3, the high ratio planetary drive system 30 includes main drive shaft 16 which extends through the ceiling wall 40 of the chamber 11 and is mounted to/coupled to the ceiling by a vacuum feedthrough, represented schematically in the FIGURE and designated by the reference numeral 31. The feedthrough may be a conventional device such as a ferrofluidic feedthrough. Drive gear A and substrate carrier plate J are mounted and fastened at spaced locations at or near the lower end of the main drive shaft 16 and thus are driven directly by the shaft 16. Driven gears D and E are fastened together (or formed as an integral pair) and are mounted on bearing assembly 32 for free rotation about the drive shaft 16 between the drive gear A and the carrier plate J. Substrate support drive shafts 33 are mounted for free rotation at spaced locations about the periphery of the plate J. The shafts or spindles 33 are mounted on bearing assemblies 34 in the plate J and are captured by arms 35 which depend from the plate. An intermediate drive gear F is mounted on the upper end of each shaft 33 and is driven by gear E. Gear E may be a chain set in a circumferential groove and intermediate gear F may be a sprocket.

One workpiece 15 or, preferably, a plurality or multiplicity of workpieces 15 are mounted to each of several arms 35 by the substrate mounting arrangement designated 36. Per this arrangement, intermediate gear G fastened to the shaft 33 is rotatably captured by the arm 35 and meshes with substrate support gear H, which illustratively supports a pair of substrates 15-15 in sockets (not shown) mounted on the gear, one substrate above and one below the gear, and thus rotates the substrate pair in unison. Additional substrate mounting assemblies 36 can be positioned along each elongated shaft 33.

A unitary or fastened pair of planetary gears B and C are mounted via bearings 37 for free rotation around a stub shaft 38 which is mounted to a horizontal baseplate 39 which itself is mounted to chamber ceiling wall 40 by a cylindrical bracket 41. The planetary gears B and C engage, respectively, drive gear A and driven gear D. That is, gear A drives planetary gear B, and coupled planetary gear C drives gear D. Preferably, two redundant gear sets BC are provided, one each on opposite sides of the main drive shaft 16, to balance the load on the drive shaft and split the load and, thus, reduce wear.

The arrangement of FIG. 3 provides a substrate rotation speed, $w_S$, defined by:

$$w_s = w_d \times \left(1 - \frac{AC}{BD}\right)\frac{EG}{FH},$$

where $w_D$ is the drive shaft speed in rpm, and
A through H are the number of gear teeth.

This equation reflects the system ability to effect slow substrate rotation relative to the main drive rotation based upon a small difference in speed between two discs, here gear E and plate J.

In the presently preferred embodiment, gears A and C are the same (same diameter and number of teeth), as are gears B and D. Also, gears A and C have one less tooth or a few fewer teeth than B and D.

EXAMPLE

The following example relates to depositing and fully oxidizing silicon and tantalum and assumes that an instantaneous deposition rate of about 150 Angstroms per second is available from silicon and tantalum sputter deposition devices located as shown in FIG. 4. It is assumed that the maximum thickness of material which is oxidizable per pass is about 5 Angstroms, and that it is desirable to deposit close to the oxidizable thickness per pass to maximize throughput. In the working example of our system constructed in accordance with the above preferred embodiment, the gears were constructed as follows:

| Gear | Teeth |
| --- | --- |
| A | 249 |
| B | 259 |
| C | 249 |
| D | 250 |
| E | 492 |
| F | 24 |
| G | 48 |
| H | 25 |

Gears A through D had a diametral pitch of 20. The diametral pitch of gears G and H was 24. Gears E and F were a ¼" circular pitch chain and associated sprocket.

The above gears provided the following rotation speeds for a main drive shaft speed of 60 rpm: gears B and C, 59.76 rpm; gears D and E, 59.52 rpm; and substrates 15 (gear H), 18.85 rpm. For the instantaneous deposition rate of about 150 A/sec., plate J diameter of about 45 in., main drive rotation of about 60 rpm, and the resulting slow planetary rotation of about 20 rpm which provided a near zero rotation rate past the 5 in. wide deposition source opening, the peak thickness per pass was about (143A/sec. * 5 in.)/(45 * 3.14 in.)=5 Angstroms, which thickness is fully oxidized. Also, the thickness of the deposited films was quite uniform, circumferential thickness run out being <2%.

It should be apparent that other gear ratios can be used in accordance with this invention. In particular, a substrate/main drive rotation ratio which is ≦1/1 and is preferably 0.1 to 0.5 will provide the required uniformity and complete reaction without the problems associated with much higher substrate speeds.

Having thus described preferred and alternative embodiments of our invention, it is to be understood that those of usual skill in the art will derive and develop extensions and improvements of the present invention that are within the scope of the following claims.

We claim:

1. A planetary rotation process for forming a thin film coating on a workpiece, comprising rotating the workpiece about a main axis past spaced deposition and reaction devices to separately deposit a selected material and chemically react the deposited material, while simultaneously rotating the substrate about a planetary axis, the ratio of the rotation speed about the planetary axis to that about the main axis being ≦1:1.

2. The process of claim 1, wherein the rotation speed ratio is within the range 1:10 to 1:2.

3. The process of claim 1, wherein the rotation speed ratio is within the range 1:4 to 1:3.

4. The process of claim 1 or 2, wherein at least two deposition devices are used, a first layer is formed by operating the first deposition device and rotating the substrate about the main axis in a selected direction to traverse the shorter distance between the first deposition device and the reaction device, then a second layer is formed by operating the second deposition device and rotating the substrate in the opposite direction to traverse the shorter distance between the second deposition device and the reaction device.

5. The process of claim 4, wherein the rotation speed ratio is within the range 1:4 to 1:3.

6. The process of claim 5, wherein the two deposition devices are located 60°-120° on opposite sides of the reaction device.

7. The process of claim 5, wherein the two deposition devices are located 90° on either side of the reaction device.

8. In the process of operating a planetary workpiece support system of the type having at least one workpiece support shaft driven by a main drive shaft with double rotation past a peripheral process station, the improvement comprising: rotatably supporting the workpiece drive shafts at the periphery of disc means; driving the disc means directly by the main drive shaft; and rotating the workpiece drive shaft by a gear rotatably mounted on the main drive shaft and driven by planetary gear means driven by the main drive shaft.

9. A system for forming a thin film coating on a workpiece, comprising: a deposition device; a reaction device; and means rotating a workpiece about a main axis past the deposition and reaction devices to separately deposit a selected material and chemically react the deposited material and simultaneously rotating the substrate about a planetary axis at a rotation speed such that the ratio of the rotation speed about the planetary axis to that about the main axis is $\leq 1:1$.

10. The system of claim 9, wherein the rotating means is adapted to provide a rotation speed ratio within the range 1:10 to 1:2.

11. The system of claim 9, wherein the rotating means is adapted to provide a rotation speed ratio within the range 1:4 to 1:3.

12. The system of claim 9, 10 or 11, the rotating means comprising: a main drive shaft; at least one workpiece support shaft; disc means mounted on and driven directly by the main drive shaft; the workpiece support shaft being mounted for rotation at the periphery of the disc means; and a gear rotatably mounted on the main drive shaft and drivingly coupled to the workpiece support shaft for driving the workpiece support shaft, said gear being driven by planetary gear means driven by the main drive shaft.

13. The system of claim 9, 10 or 11, the rotating means comprising a primary or sun drive shaft and at least one planetary workpiece support driven by the primary drive with double rotary motion past circumferential processing stations, wherein the system comprises gears A through G arranged to provide a planetary support rotational speed which is slower than the main drive shaft rotational speed according to the relationship $$w_S = w_D * (1 - AC/BD)(EG/FH),$$

where $w_S$ is the rotational speed of the planetary support, $w_D$ is the rotational speed of the primary drive, and A through H are the number of gear teeth of the like designated gears.

14. The system of claim 13, wherein gears A and J are mounted at spaced locations on and are driven directly by the main drive shaft; gears D and E are coupled together and mounted for free rotation on the main drive shaft between A and J, with D and E adjacent A and J, respectively; B and C are planetary gears coupled together for free rotation on a shaft and meshing, respectively, with A and D; and further including planetary substrate rotation means comprising at least one elongated substrate support drive shaft rotatably journalled at the periphery of gear or plate J, said substrate support drive shaft mounting gear F on one side of plate J meshing with gear E and mounting gear G on the other side of plate J, and gear H adapted for and supporting at least one workpiece, said gear H being rotatably captured to the substrate support shaft and meshing with substrate rotating gear G.

* * * * *